US009653668B2

(12) United States Patent
Chung et al.

(10) Patent No.: US 9,653,668 B2
(45) Date of Patent: May 16, 2017

(54) LED FILAMENT AND FILAMENT-TYPE LED BULB

(71) Applicants: KAISTAR Lighting (Xiamen) Co., Ltd., Xiamen (CN); InterLight Optotech Corporation, Taoyuan (TW)

(72) Inventors: Yu-Chun Chung, Xiamen (CN); Chien-Li Yang, Xiamen (CN); Hong-Zhi Liu, Xiamen (CN)

(73) Assignees: KAISTAR LIGHTING (XIAMEN) CO., LTD., Xiamen (CN); INTERLIGHT OPTOTECH CORPORATION, Taoyuan (TW)

( * ) Notice: Subject to any disclaimer, the term of this patent is extended or adjusted under 35 U.S.C. 154(b) by 0 days.

(21) Appl. No.: 14/880,198

(22) Filed: Oct. 10, 2015

(65) Prior Publication Data

US 2017/0016580 A1    Jan. 19, 2017

(30) Foreign Application Priority Data

Jul. 17, 2015    (CN) .......................... 2015 1 0423420

(51) Int. Cl.
*H01L 33/62*    (2010.01)
*F21V 19/00*    (2006.01)
*F21K 9/232*    (2016.01)

(52) U.S. Cl.
CPC .............. *H01L 33/62* (2013.01); *F21K 9/232* (2016.08); *F21V 19/003* (2013.01)

(58) Field of Classification Search
CPC .................................. H01L 33/62; F21K 9/232
USPC ........................................................ 313/498
See application file for complete search history.

(56) References Cited

U.S. PATENT DOCUMENTS

| 3,938,177 | A * | 2/1976 | Hansen | H01L 33/62 |
| | | | | 257/668 |
| 8,232,724 | B2 * | 7/2012 | Mostoller | F21S 8/031 |
| | | | | 313/512 |
| 8,858,027 | B2 * | 10/2014 | Takeuchi | F21V 23/001 |
| | | | | 362/249.02 |
| 9,261,242 | B2 * | 2/2016 | Ge | F21K 9/135 |
| 2003/0178711 | A1 * | 9/2003 | Honda | H01L 33/62 |
| | | | | 257/676 |

(Continued)

FOREIGN PATENT DOCUMENTS

| CN | 203644774 U | 6/2014 |
| CN | 203967128 U | 11/2014 |

*Primary Examiner* — Joseph L Williams
*Assistant Examiner* — Christopher Raabe
(74) *Attorney, Agent, or Firm* — Hemisphere Law, PLLC

(57) ABSTRACT

A LED filament and a LED filament bulb using the same are disclosed. The LED filament includes a carrier, a LED chip disposed on the carrier and a conductive lead connected to the carrier. The conductive lead is electrically connected to the LED chip and includes a lead head portion, a lead tail portion and a lead neck portion connecting the lead head portion with the lead tail portion. A solid body width of the lead neck portion is less than a maximum solid body width of the lead head portion. Because the lead neck portion with reduced solid body width can function as a vulnerable position of the conductive lead, when a stress is applied onto the conductive lead, the lead neck portion would first take action and therefore the bonding location between the lead head portion and the carrier or the carrier itself can be protected.

10 Claims, 5 Drawing Sheets

(56) References Cited

U.S. PATENT DOCUMENTS

| | | | |
|---|---|---|---|
| 2007/0139949 A1* | 6/2007 | Tanda | F21K 9/232 |
| | | | 362/551 |
| 2012/0217862 A1* | 8/2012 | Matsuda | F21K 9/232 |
| | | | 313/46 |
| 2014/0218924 A1* | 8/2014 | Levante | F21V 23/06 |
| | | | 362/249.04 |

* cited by examiner

LED FILAMENT AND FILAMENT-TYPE LED BULB

BACKGROUND

1. Technical Field

The invention relates to the field of LED lighting technology, and more particularly to a LED filament and a LED filament bulb.

2. Description of the Related Art

A light emitting diode (LED) is a solid semiconductor device capable of converting electrical energy into visible light. Due to the LED light source has advantages such as energy-saving, long lifetime and environmental safety, LED is an optimum substitute for the conventional light source and can be widely spread.

A conventional LED filament bulb generally includes a LED filament, a stem, a transparent lampshade such as a spherical lampshade, and a lamp holder such as a threaded lamp holder. The transparent lampshade and the stem are fixedly connected to the lamp holder, the stem is located/situated in the transparent lampshade and has electrodes disposed thereon and connected to the LED filament so as to supply power to the LED filament. As shown in FIG. 1, the LED filament includes a carrier 11 and a conductive lead 15. A conductive electrode 13 disposed on the carrier 11 and the conductive lead 15 are connected with each other by an adhesive material 14. The carrier 11 has multiple (i.e., more than one) LED chips 12 disposed thereon, and the LED chips 12 are connected in series, in parallel, or in series and parallel. During a process of producing/manufacturing the conventional LED filament bulb, the step of mounting/assembling the LED filament onto the stem is mostly operated manually. Since a position of the electrode E0 on the stem may be inconsistent (e.g. the possible positions respectively marked by the solid circle and the dotted circle in FIG. 1), in order to connect the conductive lead 15 of the LED filament to the electrode E0 on the stem, an external force is needed to tie the two parts for the convenience of welding, and thereby an external pulling/pushing force is applied onto the conductive lead 15 of the LED filament while the alignment for welding, which would easily cause the conductive lead 15 of the LED filament to be fallen off or broken and consequently cause the failure of component.

SUMMARY

Accordingly, in order to overcome the shortcomings of the prior art, the invention provides a LED filament and a LED filament bulb.

Specifically, an embodiment of the invention provides a LED filament including a carrier, a LED chip disposed on the carrier, and a conductive lead fixedly connected with the carrier. The conductive lead is electrically connected with the LED chip. The conductive lead includes a lead head portion, a lead tail portion, and a lead neck portion connecting the lead head portion with the lead tail portion. A solid body width of the lead neck portion is less than a maximum solid body width of the lead head portion.

In an exemplary embodiment of the invention, at least one side of the lead neck portion is inwardly shrunk with respect to the lead head portion so as to achieve the solid body width of the lead neck portion being less than the maximum solid body width of the lead head portion. Moreover, at least one side of the lead head portion is formed with a notch, and/or a middle portion of the lead head portion is formed with a through hole.

In an exemplary embodiment of the invention, a solid body width of the lead tail portion is larger than the solid body width of the lead neck portion.

In an exemplary embodiment of the invention, at least one side of the lead neck portion and at least one side of the lead tail portion both are inwardly shrunk with respect to the lead head portion so as to achieve the solid body width of the lead neck portion being less than the maximum solid body width of the lead head portion. Moreover, at least one side of the lead head portion is formed with a notch, and/or a middle portion of the lead head portion is formed with a through hole.

In an exemplary embodiment of the invention, the lead neck portion is formed with a through hole so as to achieve the solid body width of the lead neck portion being less than of the maximum solid body width of the lead head portion. Moreover, at least one side of the lead head portion is formed with a notch, and/or a middle portion of the lead head portion is formed with a through hole.

In an exemplary embodiment of the invention, the lead head portion of the conductive lead is fixedly connected with a conductive electrode on the carrier by an adhesive material.

In an exemplary embodiment of the invention, the conductive lead and the carrier are a single piece structure as a whole.

Furthermore, another embodiment of the invention provides a LED filament bulb including a lamp holder, a transparent lampshade, a stem, and anyone of the above-described LED filaments. The transparent lampshade and the stem are fixedly connected to the lamp holder, and the LED filament is connected to the stem by the conductive lead.

In addition, still another embodiment of the invention provides a LED filament including a strip-like carrier, at least one LED chip and a conductive lead. The at least one LED chip is disposed on the strip-like carrier. The conductive lead is disposed on one end of the strip-like carrier and electrically connected to the at least one LED chip. The conductive lead includes a bonding zone connected with the strip-like carrier, a stress releasing zone and a welding zone.

In an exemplary embodiment of the invention, the stress releasing zone is a zone of the conductive lead having a reduced solid body width with respect to the bonding zone.

In an exemplary embodiment of the invention, the stress releasing zone is a zone of the conductive lead having a smaller thickness than the bonding zone.

In an exemplary embodiment of the invention, the bonding zone and the welding zone both are multilayered conductive structures, and the stress releasing zone is a single-layered conductive structure.

Sum up, the various exemplary embodiments of the invention each make the lead neck portion be inwardly shrunk in width with respect to the lead head portion or make the lead neck portion be formed with a through hole so as to the purpose of reducing the solid body width of the lead neck portion, or make the lead neck portion have a smaller thickness than the lead head portion, so that the lead neck portion becomes a vulnerable position of the conductive lead. Therefore, when a stress is applied to the conductive lead, the lead neck portion would first take action than the other portions and thereby could protect the bonding location of the lead head portion and the carrier or the carrier itself. Moreover, by defining a notch on the side(s) of the lead head portion and/or defining a through-hole in the middle of the lead head portion, the bonding area of the lead head portion and the carrier can be increased to thereby improve the bonding strength between the lead head portion and the carrier.

By the following detailed description with reference to accompanying drawings, other aspects and features of the invention will become apparent. However, it should be understood that, the drawings only are for the purpose of explanation and not as limiting the scope of the invention, and the scope of the invention should refer to the appended claims. It also be appreciated that, unless otherwise indicated, the drawings are not necessarily drawn to scale, they are merely trying to conceptually illustrate the structures and procedures described herein.

BRIEF DESCRIPTION OF THE DRAWINGS

In the following, with reference to accompanying drawings, concrete embodiments of the invention will be described in detail. In the drawings.

DETAILED DESCRIPTION

The above embodiments will become more readily apparent to those ordinarily skilled in the art after reviewing the following detailed description and accompanying drawings.

First Exemplary Embodiment

Figure 1:
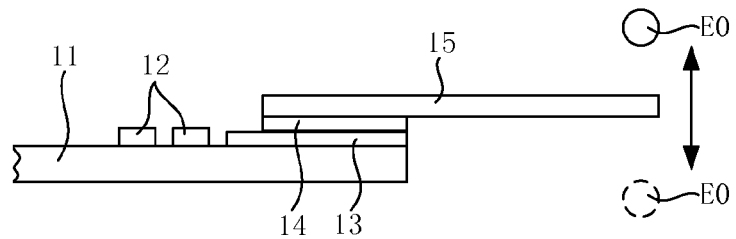
FIG. 1 is a schematic structural view of a conventional LED filament.
Figure 2A:
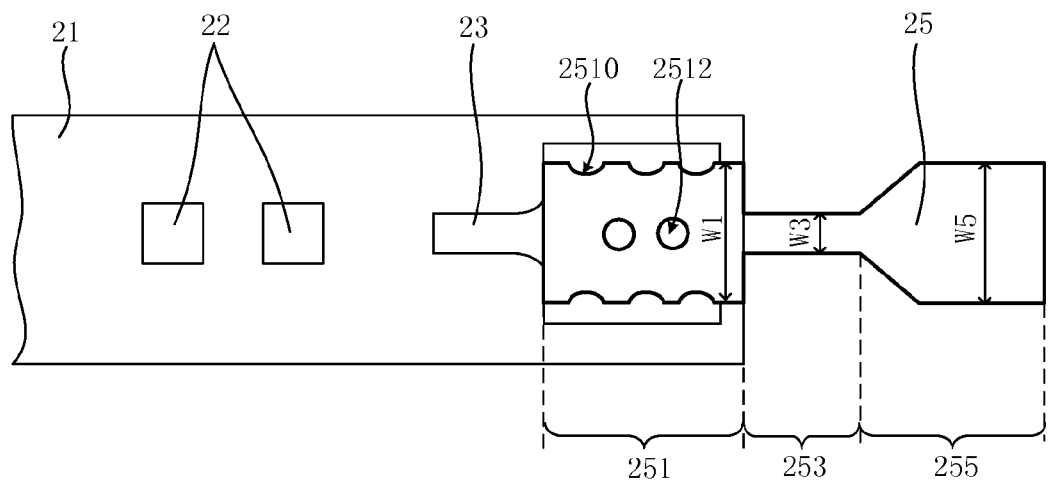
FIG. 2A is a schematic structural view of a LED filament according to a first exemplary embodiment of the invention.

Referring to FIG. 2A, a LED filament according to a first exemplary embodiment of the invention includes a carrier 21, multiple (i.e., more than one) LED chips 22 disposed on the carrier 21, and a conductive lead 25 fixedly connected with the carrier 21. The carrier 21 is used for supporting the LED chips 22, and a material of the carrier 21 for example is a transparent material like a transparent ceramic, sapphire or a glass substrate. The LED chips 22 for example are connected in series, in parallel, or in series and parallel and further generally are disposed on one side of the carrier 21. The LED chips 22 may be electrically connected with one another by metal wires and further are connected to a conductive electrode 23 pasted or printed onto the carrier 21. Herein, the conductive electrode 23 for example is a silver (Ag) pad. The conductive lead 25 is electrically connected to the LED chips 22 so as to supply power to the LED chips 22. The conductive lead 25 includes a lead head portion 251, a lead tail portion 255 and a lead neck portion 253 connecting the lead head portion 251 with the lead tail portion 255. The lead head portion 251, the lead neck portion 253 and the lead tail portion 255 typically are a single piece structure as a whole. The lead head portion 251 is fixed on the conductive electrode 23 on the carrier 21 by an adhesive material (referring to the reference number 14 in FIG. 1) to thereby make the conductive lead 25 and the carrier 21 be fixedly connected with each other. Herein, the adhesive/bonding material can be a solder paste. Furthermore, in order to ensure the bonding reliability of the conductive lead 25 with the carrier 21, preferably, a bonding length of the conductive lead 25 with the conductive electrode 23 is between ¼ to ¾ of a total length of the conductive lead 25.

The lead head portion 251 has arc-shaped notches 2510 defined at two sides and further has circular through holes 2512 defined in a middle portion, in this way, a bonding area of the lead head portion 251 with the carrier 21 is increased so as to improve the bonding strength between the lead head portion 251 and the carrier 21. Two sides of the lead neck portion 253 are inwardly shrunk with respect to the lead head portion 251, in other words, the lead neck portion 253 inwardly shrinks with respect to the lead head portion 251 in the widthwise direction of the lead neck portion 253, so as to reduce the solid body width (i.e., generally a width of non-empty portion) of the lead neck portion 253 and thereby make the lead neck portion 253 be a vulnerable position of the conductive lead 25. Therefore, when a stress is applied onto the conductive lead 25, the lead neck portion 253 would first take action (e.g., first bend and deform) to thereby protect the bonding location of the lead head portion 251 with the carrier 21. The two sides of the lead tail portion 255 do not inwardly shrink with respect to the lead head portion 251, and no notch and through hole is disposed on the two sides and in the middle of the lead tail portion 255. In the present exemplary embodiment, as shown in FIG. 2A, the maximum solid body width of the lead head portion 251 is W1, the solid body width of the lead neck portion 253 is W3, the maximum solid body width of the lead tail portion 255 is W5, and they satisfy the relationship that W5=W1>W3.

Second Exemplary Embodiment

Figure 2B:
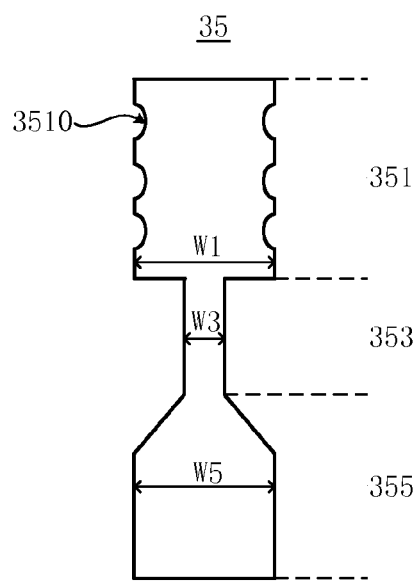
FIG. 2B is a schematic structural view of a conductive lead according to a second exemplary embodiment of the invention.

Referring to FIG. 2B, a conductive lead 35 used for a LED filament according to a second exemplary embodiment of the invention includes a lead head portion 351, an lead tail portion 355, and a lead neck portion 353 connecting the lead head portion 351 with the lead tail portion 355. The lead head portion 351, the lead neck portion 353 and the lead tail portion 355 typically are a single piece structure as a whole.

The lead head portion 351 has arc-shaped notches 3510 defined on two sides thereof, so as to increase a bonding area of the lead head portion 351 with the carrier 21 and thereby improve its bonding strength with the carrier 21. Two sides of the lead neck portion 353 are inwardly shrunk with respect to the lead head portion 351, in other words, the lead neck portion 353 inwardly shrinks with respect to the lead head portion 351 in the widthwise direction, so as to achieve the purpose of reducing the solid body width of the lead neck portion 353 and thereby make the lead neck portion 353 be a vulnerable position of the conductive lead 35. The two sides of the lead tail portion 355 do not inwardly shrink with respect to the lead head portion 351, and no notch is disposed on the two sides of the lead tail portion 355. In the present exemplary embodiment, as shown in FIG. 2B, the maximum solid body width of the lead head portion 351 is W1, the solid body width of the lead neck portion 353 is W3, the maximum solid body width of the lead tail portion 355 is W5, and they satisfy the relationship that W5=W1>W3.

Third Exemplary Embodiment

Figure 2C:
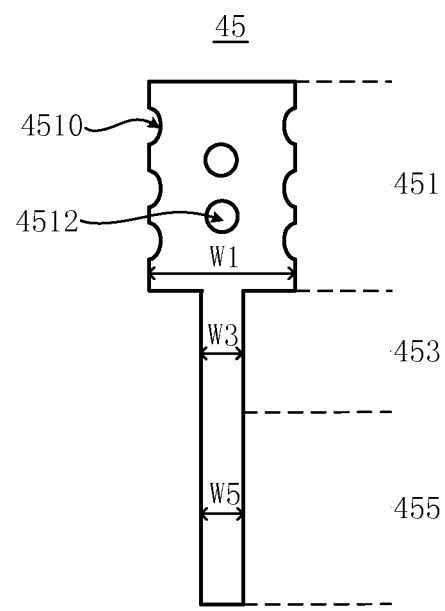
FIG. 2C is a schematic structural view of a conductive lead according to a third exemplary embodiment of the invention.

Referring to FIG. 2C, a conductive lead 45 used for a LED filament according to a third exemplary embodiment of the invention includes a lead head portion 451, an lead tail portion 455, and a lead neck portion 453 connecting the lead head portion 451 with the lead tail portion 455. The lead head portion 451, the lead neck portion 453 and the lead tail portion 455 typically are a single piece structure as a whole.

The lead head portion 451 has arc-shaped notches 4510 defined on two sides and further has circular through holes 4512 defined in the middle of the lead head portion 451, in this way, the bonding area of the lead head portion 451 with the carrier 21 is increased so as to improve the bonding strength between the lead head portion 451 and the carrier 21. Two sides of the lead neck portion 453 as well as two sides of the lead tail portion 455 are inwardly shrunk with respect to the lead head portion 451, in other words, the lead neck portion 453 and the lead tail portion 455 both inwardly shrink with respect to the lead head portion 451 in the widthwise direction, so as to reduce the solid body width of the lead neck portion 453 and thereby make the lead neck portion 453 be a vulnerable position of the conductive lead 45. In the present exemplary embodiment, as shown in FIG. 2C, the maximum solid body width of the lead head portion 451 is W1, the solid body width of the lead neck portion 453 is W3, the solid body width of the lead tail portion 455 is W5, and they satisfy the relationship that W1>W3=W5.

Fourth Exemplary Embodiment

Figure 2D:
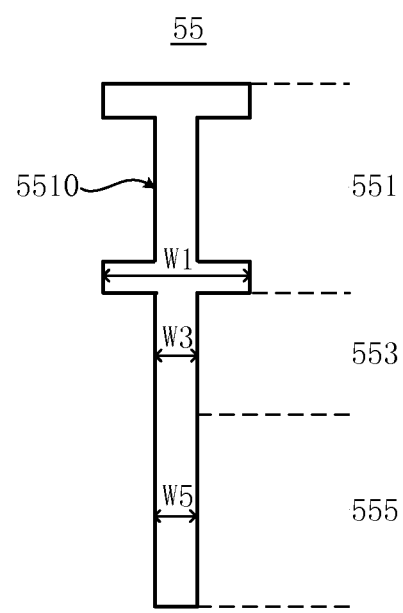
FIG. 2D is a schematic structural view of a conductive lead according to a fourth exemplary embodiment of the invention.

Referring to FIG. 2D, a conductive lead 55 used for a LED filament according to a fourth exemplary embodiment of the invention includes a lead head portion 551, an lead tail portion 555, and a lead neck portion 553 connecting the lead head portion 551 with the lead tail portion 555. The lead head portion 551, the lead neck portion 553 and the lead tail portion 555 typically are a single piece structure as a whole.

The lead head portion 551 has rectangular notches 5510 defined on two sides thereof, so as to increase the bonding area of the lead head portion 551 with the carrier 21 and thereby improve the bonding strength between the lead head portion 551 and the carrier 21. Two sides of the lead neck portion 553 as well as two sides of the lead tail portion 555 are inwardly shrunk with respect to the lead head portion 551, in other words, the lead neck portion 553 and the lead tail portion 555 both inwardly shrink with respect to the lead head portion 551 in the widthwise direction, so as to reduce the solid body width of the lead neck portion 553 and thereby make the lead neck portion 553 be a vulnerable position of the conductive lead 55. In the present exemplary embodiment, as shown in FIG. 2D, the maximum solid body width of the lead head portion 551 is W1, the solid body width of the lead neck portion 553 is W3, the solid body width of the lead tail portion 555 is W5, and they satisfy the relationship that W1>W3=W5.

Fifth Exemplary Embodiment

Figure 2E:
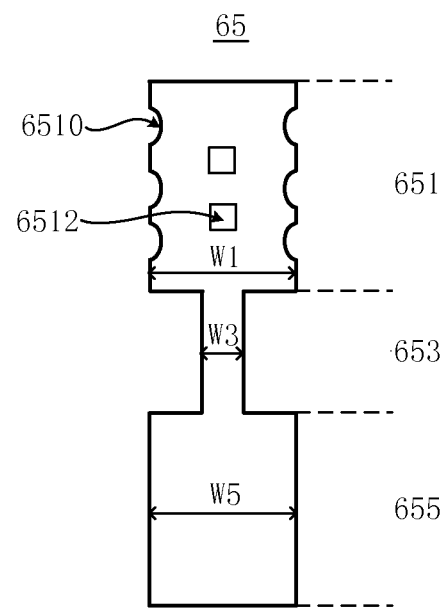
FIG. 2E is a schematic structural view of a conductive lead according to a fifth exemplary embodiment of the invention.

Referring to FIG. 2E, a conductive lead 65 used for a LED filament according to a fifth exemplary embodiment of the invention includes a lead head portion 651, an lead tail portion 655, and a lead neck portion 653 connecting the lead head portion 651 with the lead tail portion 655. The lead head portion 651, the lead neck portion 653 and the lead tail portion 655 typically are a single piece structure as a whole.

The lead head portion 651 has arc-shaped notches 6510 defined on two sides thereof and further has rectangular through holes 6512 defined in the middle portion thereof, in this way, the bonding area of the lead head portion 651 with the carrier 21 is increased, so as to improve the bonding strength between the lead head portion 651 and the carrier 21. Two sides of the lead neck portion 653 are inwardly shrunk with respect to the lead head portion 651, in other words, the lead neck portion 653 inwardly shrinks with respect to the lead head portion 651 in the widthwise direction, so as to reduce the solid body width of the lead neck portion 653 and thereby make lead neck portion 653 be a vulnerable position of the conductive lead 65. The two sides of the lead tail portion 655 do not inwardly shrink with respect to the lead head portion 651, and further no notch and through hole is disposed on the two sides and in the middle portion of the lead tail portion 655. In the present exemplary embodiment, as shown in FIG. 2E, the maximum solid body width of the lead head portion 651 is W1, the solid body width of the lead neck portion 653 is W3, the solid body width of the lead tail portion 655 is W5, and they satisfy the following relationship that W5=W1>W3.

Sixth Exemplary Embodiment

Figure 2F:
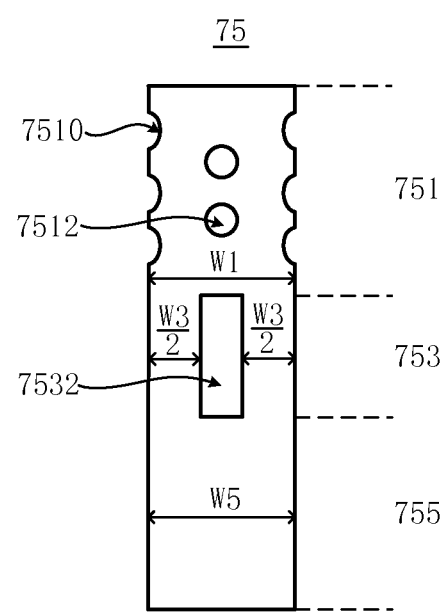
FIG. 2F is a schematic structural view of a conductive lead according to a sixth exemplary embodiment of the invention.

Referring to FIG. 2F, a conductive lead 75 used for a LED filament according to a sixth exemplary embodiment of the invention includes a lead head portion 751, an lead tail portion 755, and a lead neck portion 753 connecting the lead head portion 751 with the lead tail portion 755. The lead head portion 751, the lead neck portion 753 and the lead tail portion 755 typically are a single piece structure as a whole.

The lead head portion 751 has arc-shaped notches defined on two sides thereof and further has circular through holes 7512 defined in the middle portion of the lead head portion 751, in this way, the bonding area of the lead head portion 751 with the carrier 21 is increased to thereby improve the bonding strength between the lead head portion 751 and the carrier 21. The lead neck portion 753 has a rectangular through hole 7532 defined in the middle portion thereof so as to reduce the solid body width of the lead neck portion 753 and thereby make the lead neck portion 753 be a vulnerable position of the conductive lead 75. The two sides of the lead tail portion 755 do not inwardly shrink with respect to the lead head portion 751, and further no notch and through hole is disposed on the two sides and in the middle of the lead tail portion 755. In the present exemplary embodiment, as shown in FIG. 2F, the solid body maximum width of the lead head portion 751 is W1, the solid body width of the lead neck portion 753 is W3 (W3/2+W3/2), the solid body width of the lead tail portion 755 is W5, and they satisfy the relationship that W5=W1>W3.

Seventh Exemplary Embodiment

Figure 2G:
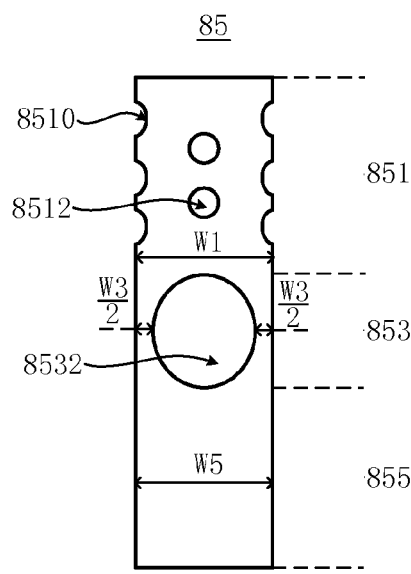
FIG. 2G is a schematic structural view of a conductive lead according to a seventh exemplary embodiment of the invention.

Referring to FIG. 2G, a conductive lead 85 used for a LED filament according to a seventh exemplary embodiment of the invention includes a lead head portion 851, an lead tail portion 855, and a lead neck portion 853 connecting the lead head portion 851 with the lead tail portion 855. The lead head portion 851, the lead neck portion 853 and the lead tail portion 855 typically are a single piece structure as a whole.

The lead head portion 851 has arch-shaped notches 8510 defined on two sides thereof and further has circular through holes 8512 defined in the middle of the lead head portion 851, in this way, the bonding area of the lead head portion 851 with the carrier 21 is increased so as to improve the bonding strength between the lead head portion 851 and the carrier 21. The lead neck portion 853 has a circular through hole 8532 defined in the middle thereof so as to reduce the solid body width of the lead neck portion 853 and thereby make the lead neck portion 853 be a vulnerable position of the conductive lead 85. The two sides of the lead tail portion 855 do not inwardly shrink with respect to the lead head portion 851, and further no notch and through hole is disposed on the two sides and in the middle of the lead tail portion 855. In the present exemplary embodiment, as shown in FIG. 2G, the maximum solid body width of the lead head portion 851 is W1, the solid body width of the lead neck portion 853 is W3 (i.e., W3/2+W3/2), the solid body width of the lead tail portion 855 is W5, and they satisfy the relationship that W5=W1>W3.

To be clarified, the shapes of the notches defined on the sides of the lead head portion of each of the conductive leads according to the first to seventh exemplary embodiments are not limited to be arc-shaped or rectangular, and can be any other shape such as triangular. The notches are not limited be defined on the two sides of the lead head portion and may be only defined on one side of the lead head portion instead. Moreover, the through holes defined in the middle of the lead head portion are not limited to be circular or rectangular, and can be any other shape such as triangular. Additionally, the through hole defined in the middle of the lead neck portion is not limited to be rectangular or circular, and can be any other shape such as triangular.

Eighth Exemplary Embodiment

Figure 3:
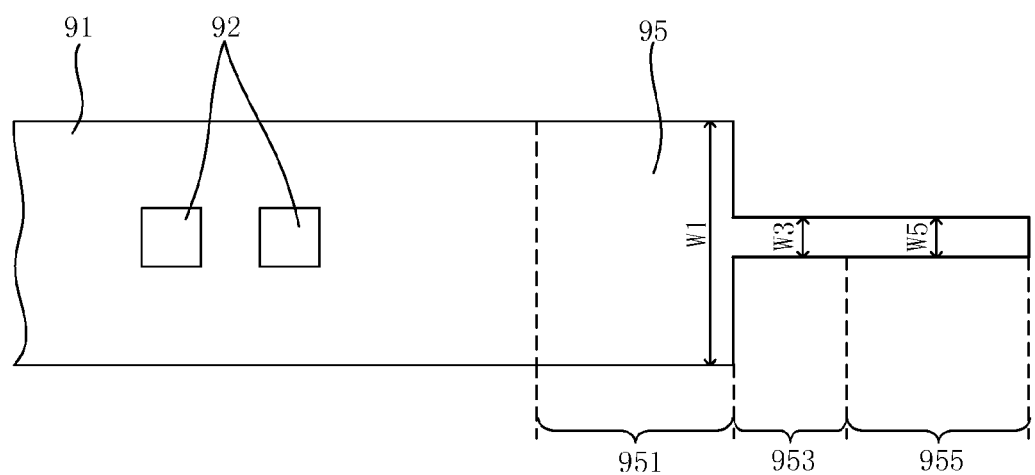
FIG. 3 is a schematic structural view of a LED filament according to an eighth exemplary embodiment of the invention.

Referring to FIG. 3, a LED filament according to an eighth exemplary embodiment of the invention includes a carrier 91, several LED chips 92 disposed on the carrier 91, and a conductive lead 95 outwardly extending from the carrier 91. The conductive lead 95 and the carrier 91 as a whole are a single piece structure. The carrier 91 is used for supporting the LED chips 92, and a material of the carrier 91 can be a conductive material such as a metal substrate, and preferably through-holes (not shown in FIG. 3) are defined on the metal substrate to make the carrier 91 be partially transparent. The several LED chips 92 for example are connected in series, in parallel, or in series and parallel, and further generally are fixed on one side of the carrier 91. The LED chips 92 can be electrically connected with one another by metal wires disposed on the carrier 91. The conductive lead 95 is electrically connected to the LED chips 92 so as to supply power to the LED chips 92. The conductive lead 95 includes a lead head portion 951, a lead tail portion 955 and a lead neck portion 953 connecting the lead head portion 951 with the lead tail portion 955. The lead head portion 951, the lead neck portion 953 and the lead tail portion 955 typically are a single piece structure as a whole.

Two sides of the lead neck portion 953 as well as two sides of the lead tail portion 955 are inwardly shrunk with respect to the lead head portion 951, in other words, the lead neck portion 953 and the lead tail portion 955 both inwardly shrink with respect to the lead head portion 951 in the widthwise direction, so as to reduce the solid body width of the lead neck portion 953 and thereby make the lead neck portion 953 be a vulnerable position of the conductive lead 95. In the present exemplary embodiment, as shown in FIG. 3, the solid body width of the lead head portion 951 is W1, the solid body width of the lead neck portion 953 is W3, the solid body width of the lead tail portion 955 is W5, and they satisfy the relationship that W1>W3=W5.

It is noted that, in the foregoing eighth exemplary embodiment, a solution of a through-hole being defined on the lead neck portion can be used to replace that the lead neck portion is inwardly shrunk in the widthwise direction, so as to reduce the solid body width of the lead neck portion. Furthermore, the shape design of the lead tail portion according to the eighth exemplary embodiment can employ the shape as shown in FIG. 2A, 2B, 2E, 2F or 2G.

Ninth Exemplary Embodiment

Figure 4:
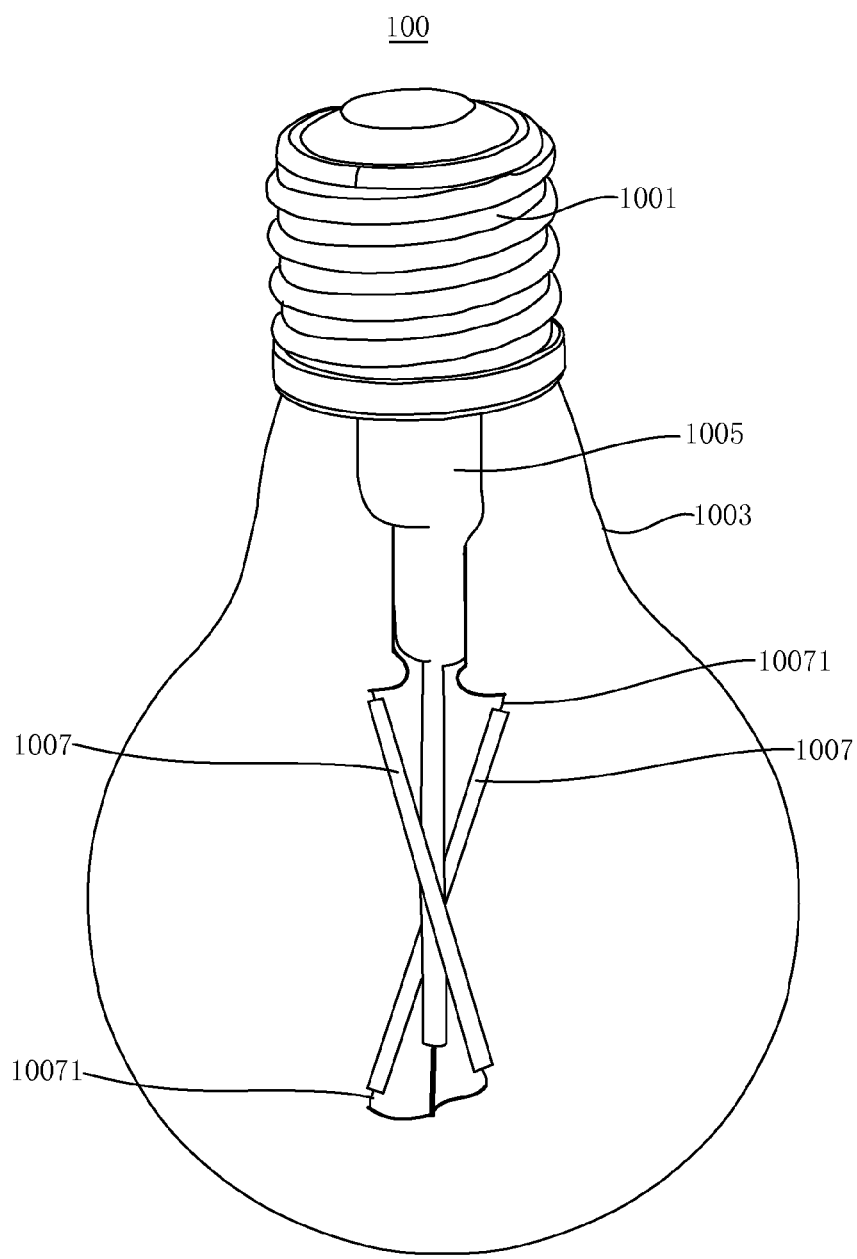
FIG. 4 is a schematic structural view of a LED filament bulb according to a ninth exemplary embodiment of the invention.

Referring to FIG. 4, a LED filament bulb 100 includes a lamp holder 1001, a transparent lampshade 1003, a stem 1005 and at least one (e.g., multiple) LED filament 1007. The lamp holder 1001 for example is a threaded lamp holder. The transparent lampshade 1003 and the stem 1005 both are fixedly connected to the lamp holder 1001. The stem 1005 generally has wires disposed thereon respectively as cathode and anode electrodes. The cathode and anode electrodes are connected to an external power source by the lamp holder 1001. Conductive leads 10071 of each the LED filament 1007 respectively are electrically connected to the cathode and anode electrodes disposed on the stem 1005, so as to supply external power to LED chips on the LED filament 1007. Moreover, the quantity/amount of the LED filament 1007 can be one or multiple depending on the actual requirement. In the present exemplary embodiment, each the LED filament 1007 can be the LED filament shown in FIG. 2A according to the first exemplary embodiment or the LED filament shown in FIG. 3 according to the eighth exemplary embodiment; the structure of the conductive leads 10071 of the LED filament can be any one of the structures of conductive leads as shown in from FIGS. 2B to 2G; and the detailed structures of various parts of the LED filament 1007 can refer to FIGS. 2A to 2G and FIG. 3 and thus will not be repeated herein.

In addition, it is noted that, as seen from the solid body widths labeled in FIGS. 2A to 2G and FIG. 3, it can be found that the solid body widths in the first to eighth exemplary embodiments of the invention can be understood as the widths of non-empty parts of various portions (i.e., lead head portion, lead neck portion and lead tail portion) of the conductive lead in the widthwise direction.

Finally, it is indicated that, the conductive lead in any one of the above-mentioned exemplary embodiments is divided into the lead head portion, the lead neck portion and the lead tail portion. The lead head portion is suitable for being fixedly connected with the carrier e.g., via an adhesive material by bonding, and therefore the lead head portion can be named as bonding zone, the carrier herein can be a strip-like structure (i.e., generally elongated structure) used for a LED filament. The lead neck portion has a reduced solid body width with respect to the lead head portion and therefore acts as a stress releasing zone. The lead tail portion is suitable for being fixed to the electrodes on the stem of the LED filament bulb by welding and therefore can be named as welding zone. Furthermore, in the foregoing exemplary embodiments, the stress releasing zone (corresponding to the lead neck portion) is designed to have a reduced solid body width with respect to the bonding zone (corresponding to the lead head portion), but the invention is not limited to this and can be that the stress releasing zone is designed to have a smaller thickness than the bonding zone instead, for example the exemplary embodiment as shown in FIG. 5.

Figure 5:
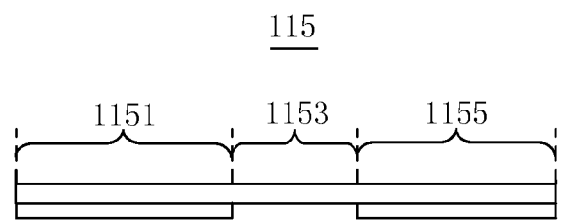
FIG. 5 is a schematic structural view of a conductive lead according to other exemplary embodiment of the invention.

Specifically, as shown in FIG. 5, a conductive lead 115 includes a lead head portion 1151, a lead neck portion 1153 and a lead tail portion 1155 respectively corresponding to a bonding zone, a stress releasing zone and a welding zone. In order to achieve that the lead neck portion 1153 has a smaller thickness than the lead head portion 1151, for example, the lead head portion 1151 and the lead tail portion 1155 both are formed to be multilayered (e.g., two or more than two layers) conductive structures, while the lead neck portion 1153 is formed to be a single-layered conductive structure.

In summary, the foregoing exemplary embodiments of the invention each make the lead neck portion be inwardly shrunk in width with respect to the lead head portion or make the lead neck portion be formed with a through hole so as to reduce the solid body width of the lead neck portion, or make the lead neck portion have a smaller thickness compared with the lead head portion, so that the lead neck portion becomes the vulnerable position of the conductive lead. Therefore, when a stress is applied onto the conductive lead, the lead neck portion would first take action (e.g., first bend and deform) and thereby could protect the bonding location of the lead head portion with the carrier or the carrier itself. Moreover, by defining notches on the side(s) of the lead head portion and/or defining through-holes in the middle of the lead head portion, the bonding area of the lead head portion and the carrier can be increased and thereby the bonding strength between the lead head portion and the carrier can be improved consequently.

The above description illustrates various exemplary embodiments to explain the principles and implementations of the LED filament and the LED filament bulb of the invention, and the foregoing exemplary embodiments only are used to help understand the solution of the invention and its core idea. For those skilled persons in the art, various modifications and variations can be made according to the concept of the invention, and therefore the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A LED filament comprising a carrier, a plurality of LED chips disposed on the carrier, and a one-piece conductive lead fixedly connected to the carrier; wherein the one-piece conductive lead is electrically connected to the LED chips to supply power to the LED chips, and the one-piece conductive lead comprises a lead head portion, a lead tail portion and a lead neck portion connecting the lead head portion with the lead tail portion; the lead tail portion is for electrically connecting with a wire in a bulb for lighting and the wire being as a cathode electrode or an anode electrode of the bulb; the lead neck portion is formed with a through hole in a middle portion thereof such that the lead neck portion has a reduced solid body width less than a maximum solid body width of the lead head portion.

2. The LED filament according to claim 1, wherein at least one side of the lead head portion is formed with a notch, and/or a middle portion of the lead head portion is formed with a through hole.

3. The LED filament according to claim 1, wherein a solid body width of the lead tail portion is larger than the reduced solid body width of the lead neck portion and equal to the maximum solid body width of the lead head portion.

4. The LED filament according to claim 1, wherein the lead head portion of the conductive lead is overlapped with a conductive electrode on the carrier and bonded with the conductive electrode by an adhesive material and whereby the conductive electrode is located between the carrier and the lead head portion, the LED chips are electrically connected to the conductive electrode.

5. A LED filament bulb comprising a lamp holder, a transparent lampshade, a stem and the LED filament according to claim 1; wherein the transparent lampshade and the stem are fixedly connected to the lamp holder, and the LED filament is connected to the stem by the conductive lead.

6. The LED filament bulb according to claim 5, wherein at least one side of the lead head portion is formed with a notch, and/or a middle portion of the lead head portion is formed with a through hole.

7. The LED filament bulb according to claim 5, wherein a solid body width of the lead tail portion is larger than the reduced solid body width of the lead neck portion and equal to the maximum solid body width of the lead head portion.

8. The LED filament bulb according to claim 5, wherein the lead head portion of the conductive lead is overlapped with a conductive electrode on the carrier and bonded with the conductive electrode by an adhesive material and whereby the conductive electrode is located between the carrier and the lead head portion, the LED chips are electrically connected to the conductive electrode.

9. A LED filament comprising:
a strip-like carrier;
at least one LED chip, disposed on the strip-like carrier; and
a conductive lead, disposed on one end of the strip-like carrier and electrically connected to the at least one LED chip to supply power to the at least one LED chip, wherein the conductive lead comprises a bonding zone connected with the strip-like carrier, a welding zone, and a stress releasing zone connecting the bonding zone with the welding zone; the welding zone is for electrically connecting with a wire in a bulb for lighting and the wire being as a cathode electrode or an anode electrode of the bulb;
wherein the stress releasing zone is a zone of the conductive lead having a through hole formed in a middle portion thereof and thereby having a reduced solid body width with respect to the bonding zone; or the stress releasing zone is a zone of the conductive lead having a smaller thickness with respect to the bonding zone, the stress releasing zone is a single-layered conductive structure, the bonding zone and the welding zone both are multilayered conductive structures and each comprise at least two layers stacked together along a thicknesswise direction of the conductive lead.

10. The LED filament according to claim 9, wherein a solid body width of the welding zone is equal to a maximum solid body width of the bonding zone.

* * * * *